(12) United States Patent
Dory et al.

(10) Patent No.: US 7,479,687 B2
(45) Date of Patent: Jan. 20, 2009

(54) DEEP VIA SEED REPAIR USING ELECTROLESS PLATING CHEMISTRY

(75) Inventors: Thomas S. Dory, Gilbert, AZ (US); Kenneth N. Wong, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/280,067

(22) Filed: Nov. 15, 2005

(65) Prior Publication Data

US 2006/0068181 A1  Mar. 30, 2006

Related U.S. Application Data

(62) Division of application No. 10/672,029, filed on Sep. 25, 2003, now abandoned.

(51) Int. Cl.
*H01L 29/00* (2006.01)
*H01L 29/06* (2006.01)

(52) U.S. Cl. .................. 257/508; 257/520; 257/622; 257/626; 257/751; 257/762; 257/768

(58) Field of Classification Search ............. 257/508, 257/520, 622, 626, 751, 762, 768
See application file for complete search history.

(56) References Cited

U.S. PATENT DOCUMENTS

| | | | |
|---|---|---|---|
| 5,824,599 A * | 10/1998 | Schacham-Diamand et al. | 438/678 |
| 5,882,498 A * | 3/1999 | Dubin et al. | 205/261 |
| 5,969,422 A * | 10/1999 | Ting et al. | 257/762 |
| 6,271,591 B1 * | 8/2001 | Dubin et al. | 257/751 |
| 6,398,855 B1 | 6/2002 | Palmans et al. | |
| 6,403,481 B1 | 6/2002 | Matsuda et al. | |
| 6,472,310 B1 * | 10/2002 | Achuthan et al. | 438/627 |
| 6,559,546 B1 | 5/2003 | Achuthan et al. | |
| 6,824,666 B2 | 7/2003 | Gandikota et al. | |
| 6,696,758 B2 * | 2/2004 | Dubin et al. | 257/750 |
| 2002/0043466 A1 | 4/2002 | Dordi et al. | |

FOREIGN PATENT DOCUMENTS

| | | |
|---|---|---|
| EP | 0 871 218 A2 | 10/1998 |
| EP | 0 871 218 A3 | 7/1999 |
| EP | 1 201 786 A2 | 5/2002 |

(Continued)

OTHER PUBLICATIONS

Pending U.S. Appl. No. 10/672,029, filed Sep. 25, 2003; inventor: Dory; Office Action dated Sep. 1, 2006.

(Continued)

*Primary Examiner*—Cathy Lam
(74) *Attorney, Agent, or Firm*—Kathy J. Ortiz (57) ABSTRACT

Methods of forming a continuous seed layer in a high aspect via and its associated structures are described. Those methods comprise forming a recess in a substrate, forming a non-continuous metal layer within the recess, activating the non-continuous metal layer and a plurality of non-deposited regions within the recess, electrolessly depositing a seed layer on the activated non-continuous metal layer and the plurality of non-deposited regions within the recess, and electroplating a metal fill layer over the seed layer, to form a substantially void-free metal filled recess.

7 Claims, 10 Drawing Sheets

FOREIGN PATENT DOCUMENTS

EP    1 201 786  A3    2/2004

OTHER PUBLICATIONS

PCT/US2004/031447 Int'l Search Report dated Sep. 23, 2004.

PCT/US2004/031447 Int'l Preliminary Report on Patentability Apr. 6, 2006.

Hong-Hui Hsu et al., "Displacement Activation of Tantalum Diffusion Barrier Layer for Electroless Copper Deposition", Journal of the Electrochemical Society, 2001, pp. C590-C598, XP-002313839, XP-002313840, The Electrochemical Society, Inc., USA.

* cited by examiner

DEEP VIA SEED REPAIR USING ELECTROLESS PLATING CHEMISTRY

This U.S. Patent application is a divisional of U.S. patent application Ser. No. 10/672,029 filed Sep. 25, 2003 now abandoned.

FIELD OF THE INVENTION

The present invention relates to the field of microelectronic processing, and more particularly to methods of forming continuous metal films in deep vias and structures formed thereby.

BACKGROUND OF THE INVENTION

Figure 2:
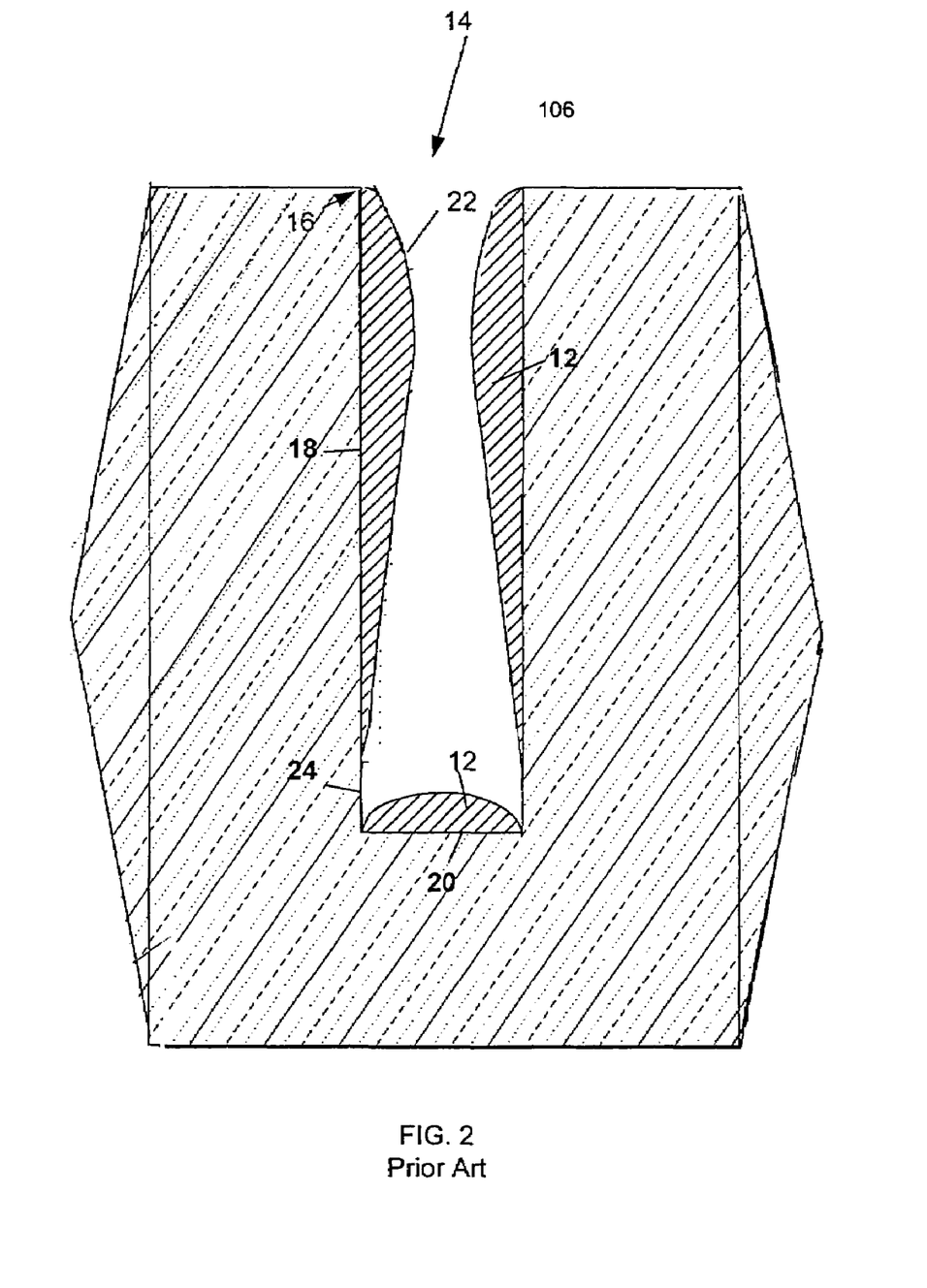
FIG. 2 represents a cross section of a structure in the Prior Art.

In the manufacture of microelectronic devices, it is now the practice to fabricate recesses or vias to connect multiple levels of conductive (typically metal) layers in a substrate. The multiple metallization layers are employed in order to accommodate higher densities as device dimensions shrink well below one micron design rules. One type of metal film that is widely used as a material for via metallization is copper. Typically, a copper seed layer 12 (see FIG. 2) is sputtered into a via opening 14, and then the via opening 14 is filled by electroplating it with a copper fill layer (not shown). However, one serious disadvantage of sputtering the copper seed layer 12 into the via opening 14 is that the deposition rate of the copper seed layer 12 near the top corners 16 of the via opening 14 will be greater than near the sidewalls 18 and bottom 20 of the via opening 14. This results in an overhang 22 being formed at the top of the via opening 14 which shadows, (i.e., impairs) the copper deposition on the sidewalls 18 and bottom 20 of the via opening 14. This shadowing effect may cause voids 24, or areas of metal discontinuity, to form in the via opening 14, since additional sputter deposition cannot adequately reach the bottom 20 and sidewalls 18 of the via opening 14 due to the overhang 22 at the top of the via opening 14 which tends to block further sputter deposition into the via opening 14.

For high aspect ratio (i.e, greater than 3:1) vias in a microelectronic device, it is very difficult or impossible to sputter deposit a continuous seed layer on the sidewalls and bottom of a via due to the shadowing effect during the sputter deposition process. In other words, the sputtered seed layer will not be continuous within the via. This means that when a copper film is later electroplated to fill the via, the via will exhibit voids in the via fill metallization that can negatively effect the device reliability and performance. Accordingly, it is desirable to form a continuous seed layer upon which to plate a metal fill layer in order to prevent the formation of voids in a high aspect ratio via. The present invention provides such methods and their associated structures.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods of forming a copper film in a high aspect ratio recess and its associated structures are described. Those methods comprise forming a recess, forming a non-continuous metal layer within the recess, activating the non-continuous metal layer and a plurality of non-deposited regions within the recess, electrolessly plating a seed layer within the recess, and electroplating a metal fill layer over the seed layer, to form a substantially void-free, metal filled recess. The combination of sputtering a non-continuous metal layer followed by electrolessly plating a seed layer on the non-continuous metal layer enables the substantially void free, substantially 100% metal coverage over the bottom and inner sidewall of the recess.

Figure 1A:
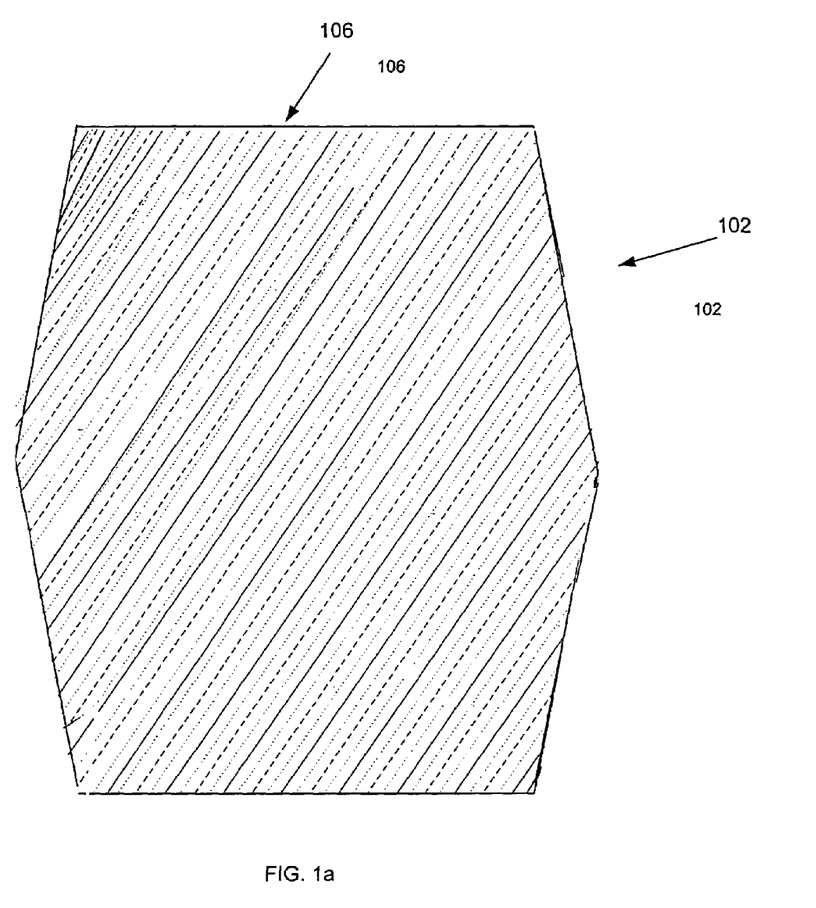
FIGS. 1a-1i represent cross-sections of structures that may be formed when carrying out an embodiment of the method of the present invention.

FIGS. 1a-1f illustrate a method of fabricating a microelectronic structure. In one embodiment of the method of the present invention, FIG. 1a illustrates a substrate 102, including but not limited to silicon, silicon dioxide, silicon nitride, silicon oxynitride, and the like. It is, of course, understood that the substrate 102 can occur anywhere within a microelectronic device. The substrate may also include the side opposite to the primary device side, i.e., the "backside" of a silicon wafer, as is well known in the art. The substrate 102 comprises a first surface 106.

Figure 1B:
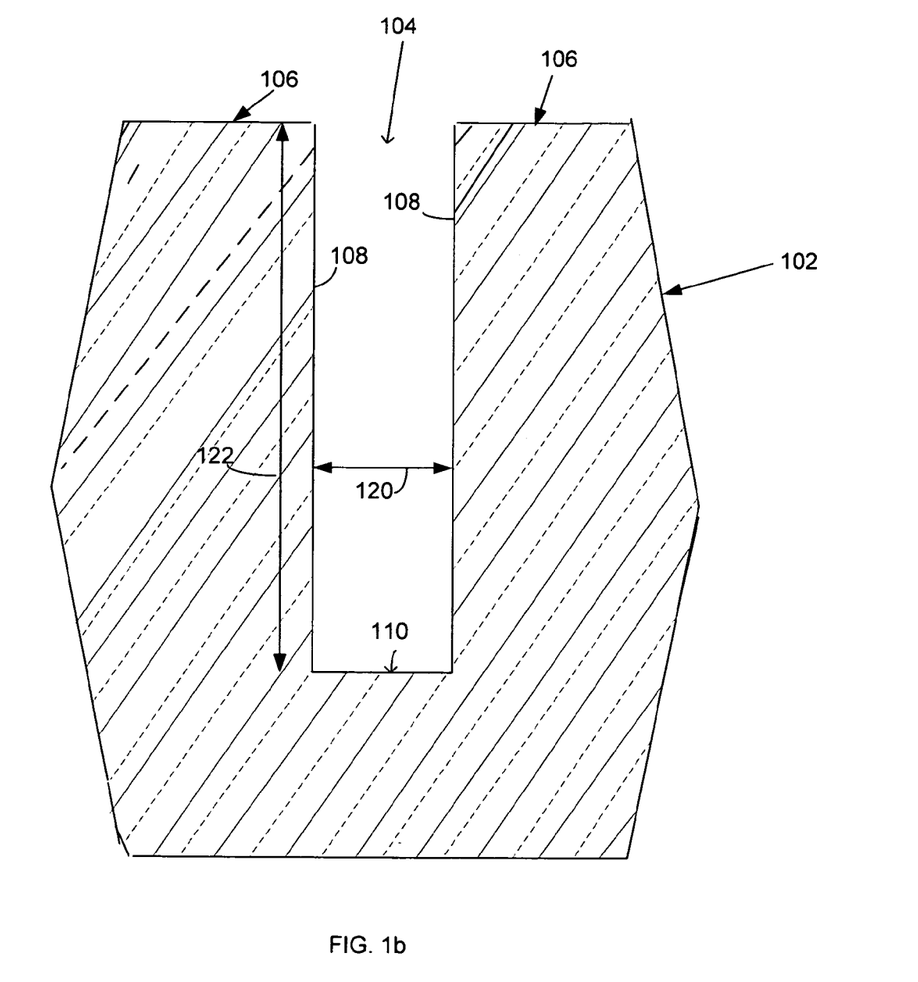
Figure 1C:
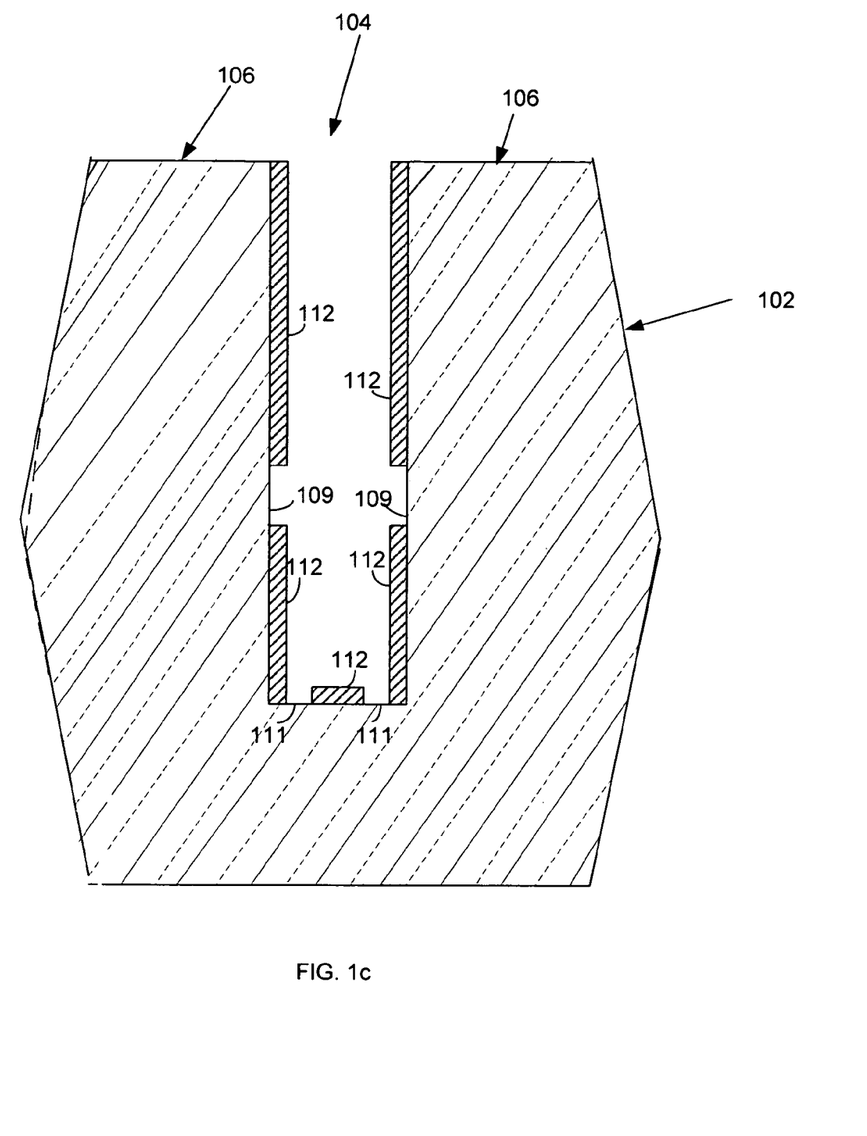

As shown in FIG. 1b, the substrate 102 is then patterned and etched, by methods well known in the art, to form a recess 104 (such as a trench or via) which extends from the first surface 106 of the substrate 102 into the substrate 102. The recess 104 comprises inner walls 108 and a bottom 110. The recess 104 may be a high aspect ratio recess, in which the ratio of the width 120 of the recess 104 to the height 122 of the recess 104 may be greater than 3:1, i.e., the recess 104 preferably comprises an aspect ratio greater than 3:1.

Because the recess 104 is a high aspect recess, a non-continuous metal layer 112 may be formed within the recess 104 due to the shadowing effects previously discussed herein. The non-continuous metal layer 112 may be formed by a sputter deposition process, or by other physical sputtering deposition processes, such as atomic layer deposition (ALD), or chemical deposition processes such as plasma enhanced chemical deposition, (PECVD) as is well known in the art. The temperature of the deposition may be about 100 to 200 degrees Celsius. The pressure may be from about 1 to about 10 milliTorr, and the power may be from 5 to about 10 KW.

The materials used to form the non-continuous metal layer 112 may include but are not limited to tantalum, tantalum nitride, tantalum silicon nitride, tungsten, titanium, titanium tungsten, titanium nitride, titanium silicon nitride and combinations of these materials. The non-continuous metal layer 112 may provide a diffusion barrier to subsequently formed copper or copper alloy layers. The thickness of the non-continuous metal layer 112 may be from about 300 to about 500 Ångstroms, and is preferably less than 500 Ångstroms.

Because the recess 104 is preferably a high aspect ratio recess, the non-continuous metal layer 112 may not substantially form over, or entirely cover the inner walls 108 and bottom 110 of the recess 104. Non-deposited regions within the recess 104 may be formed due to the phenomenon of the sputter shadowing effect (previously described herein, see FIG. 2), wherein a thicker sputtered layer forms near the top of a high aspect recess, such as recess 104, than near the bottom of the recess, and the thicker layer near the top of the recess tends to block the complete metal coverage within the high aspect ratio recess. Consequently, there may be a plurality of non-deposited regions within the recess 104 that are not covered by the non-continuous metal layer 112, shown in FIG. 1c as a non-deposited inner wall region 109 and a non-deposited bottom region 111. These non-deposited regions within the recess 104 do not have the non-continuous metal layer 112 disposed upon them.

Figure 1D:
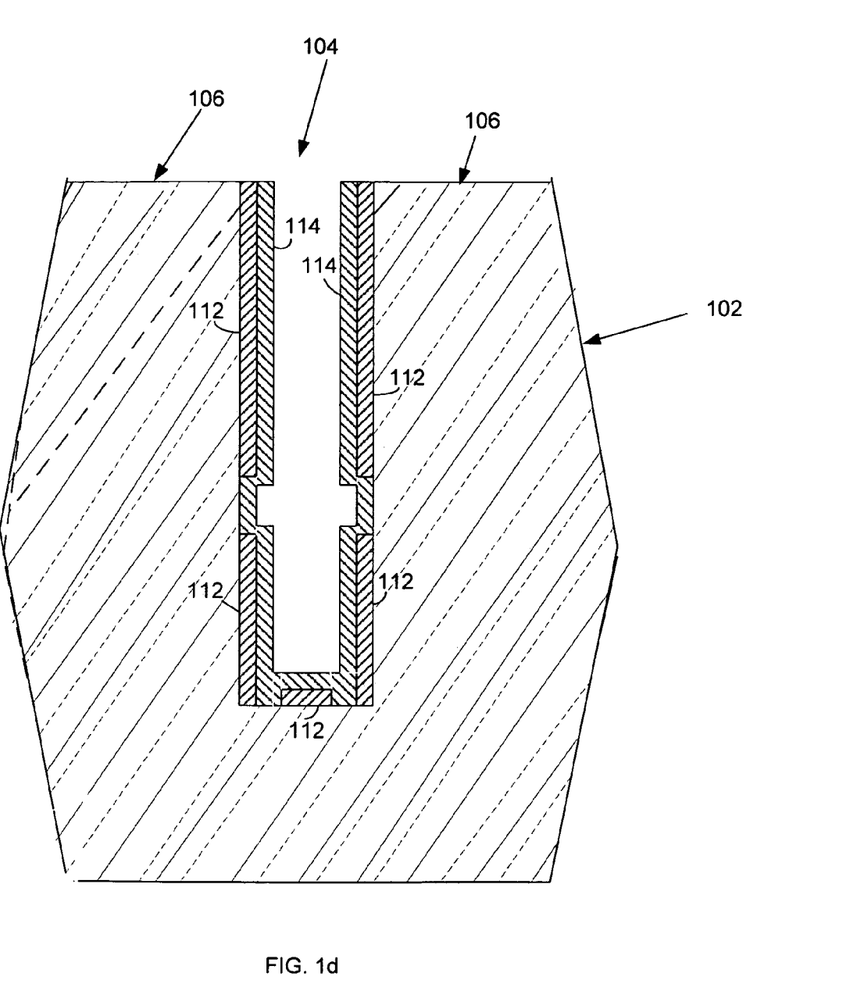

As shown in FIG. 1d, the non-continuous metal layer 112, the non-deposited inner wall region 109 and the non-deposited bottom region 111 within the recess 104 may be activated by forming an activation layer 114 on the non-continuous metal layer 112, on the non-deposited inner wall region 109 and on the non-deposited bottom region 111. The activation layer 114 may include, but is not limited to palladium or platinum, and may be contained in a solution comprising palladium chloride (Pd $Cl_2$) or platinum chloride (Pt$Cl_2$), for example.

The activation layer 114 may be formed on the non-continuous metal layer 112 by a contact displacement method, in which the non-continuous metal layer 112 is placed in a solution bath that may comprise Pd or Pt ions, a reducing agent (such as, but not limited to hypophosphite, dimethylamine borane or hydrazine) a complexing agent (such as acetic acid or citric acid) and an acid (such as, but not limited to hydrofluoric acid, hydrochloric acid, or nitric acid) or a base (such as but not limited to tetramethylammonium hydroxide or potassium hydroxide). The activation layer 114 may be less than 300 Ångstroms, and is typically about 100 Ångstroms. The activation layer 114 activates, or prepares, the non-continuous metal layer 112, the non-deposited inner wall region 109 and the non-deposited bottom region 111 for an autocatalytic reaction, such as an electroless deposition reaction.

Figure 1E:
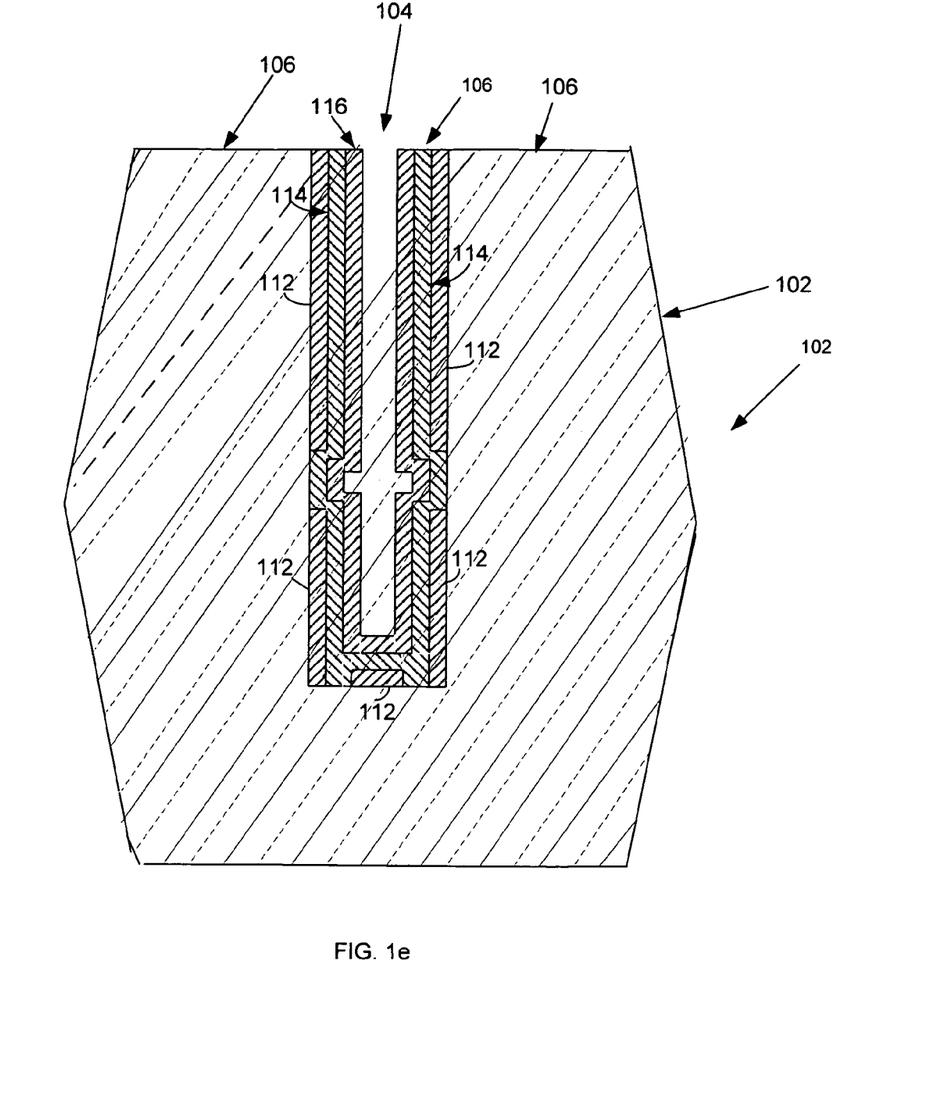
Figure 1F:
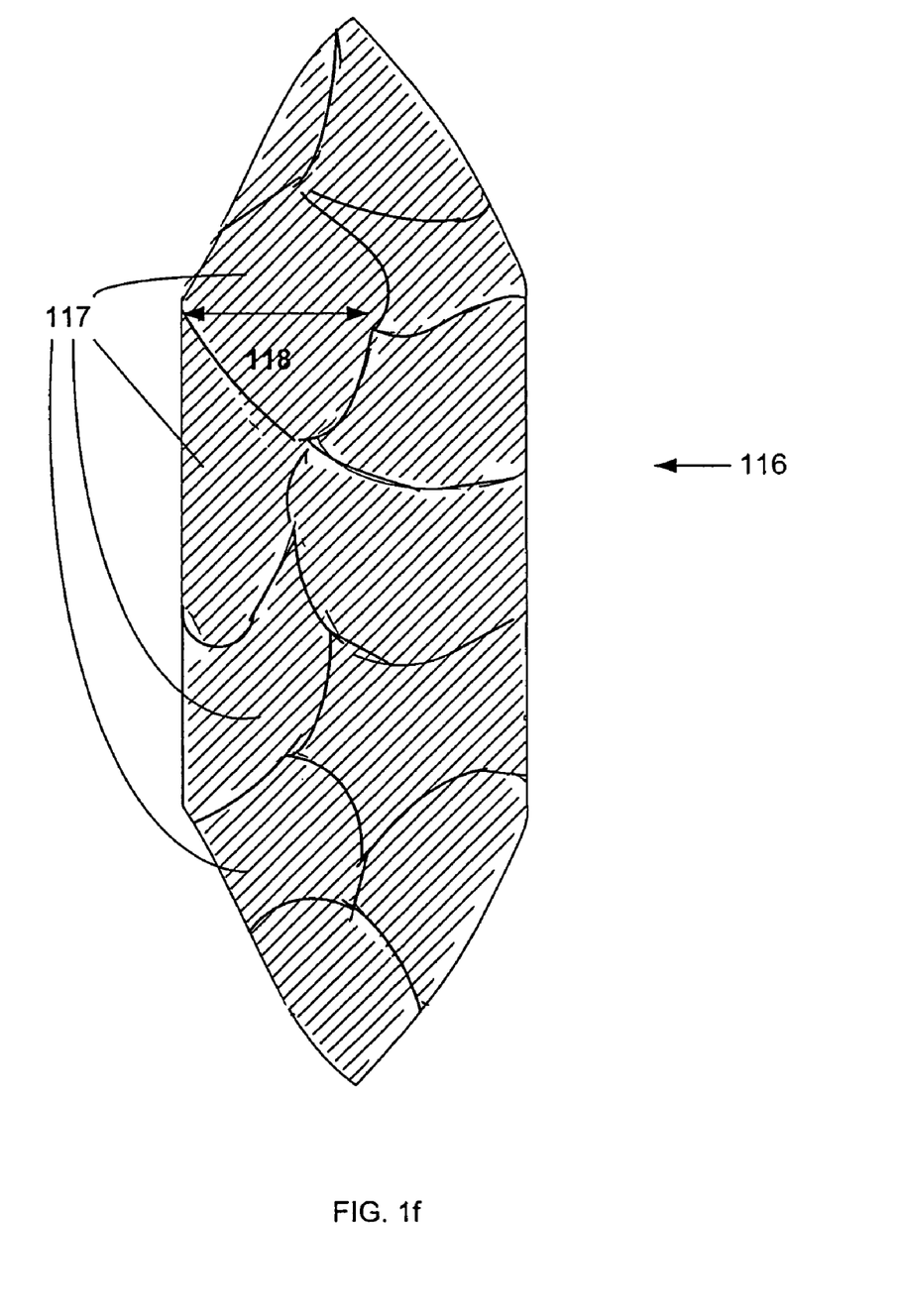
Figure 1G:
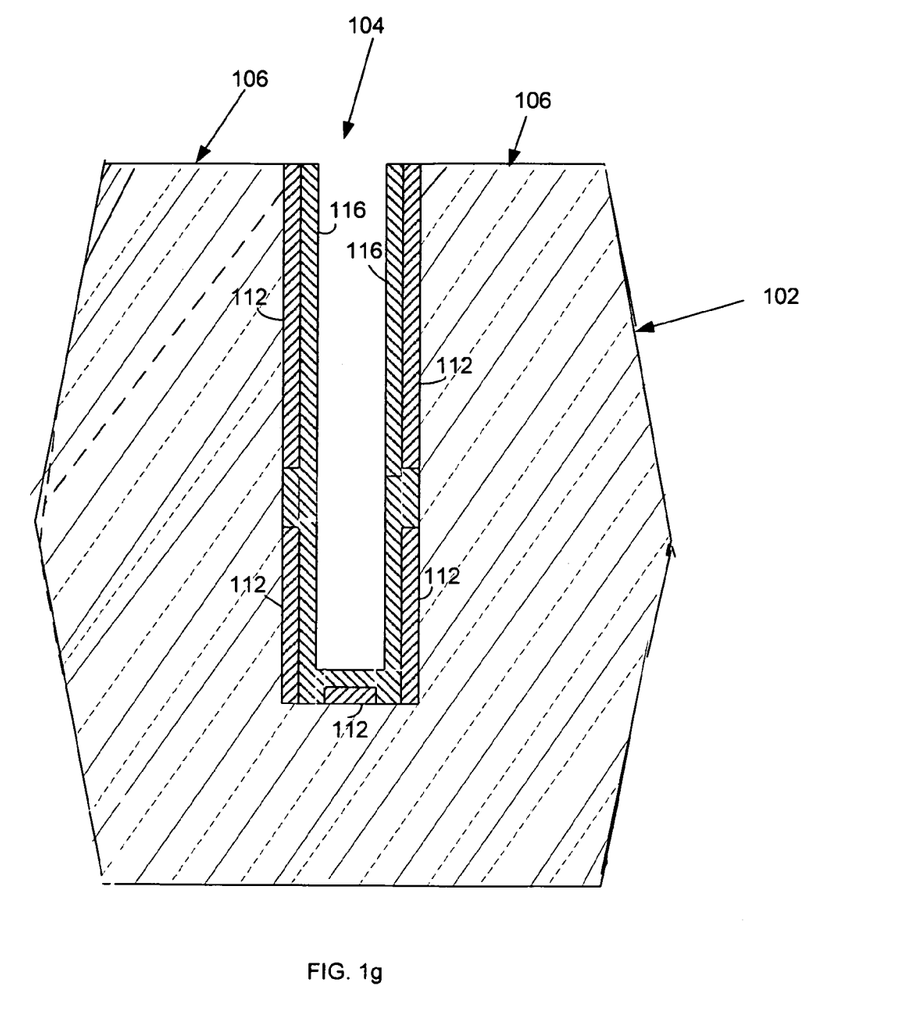

As shown in FIG. 1e, a seed layer 116 may be formed on the activation layer 114 by electroless deposition. The seed layer 116 may comprise metallic materials including but not limited to copper. The seed layer 116 forms a substantially 100% continuous metal film coverage over the activation layer 114 (and therefore provides substantially 100% step coverage over the inner wall 108 and bottom 110 of the recess 104). The electrolessly plated seed layer 116 comprises a plurality of grains 117 that generally comprise a diameter 118 that is about 1 micron (see FIG. 1f) or greater. As is well known in the art, the activation layer 114 may be substantially subsumed during the electroless deposition of the seed layer 116 (see FIG. 1g) or may remain intact as depicted in FIG. 1e.

One of a variety of known electroless deposition solutions can be utilized to electrolessly deposit the seed layer 116. The electroless solution of the preferred embodiment may comprise copper sulfate to supply the copper$^{2+}$ cations, ethylenediaminetetraacetic acid (EDTA) as a complexing agent for the copper$^{2+}$ cations, quaternary ammonium hydroxides to supply the hydroxide anions, formaldehyde (HCHO) or glyoxylic acid as a reducing agent, RHODAFAC RE 610™ or polyethylene glycols as a surfactant and wetting agent, and ammonium cyanide or 2,2"-dipyridyl as stabilizer and ductility promoter. After the electroless deposition of the seed layer 116, the substrate 102 may be rinsed in deionized water to remove the electroless deposition solution. It is appreciated that the formation of the seed layer 116 is timed so that it does not substantially fill the recess 104.

Figure 1H:
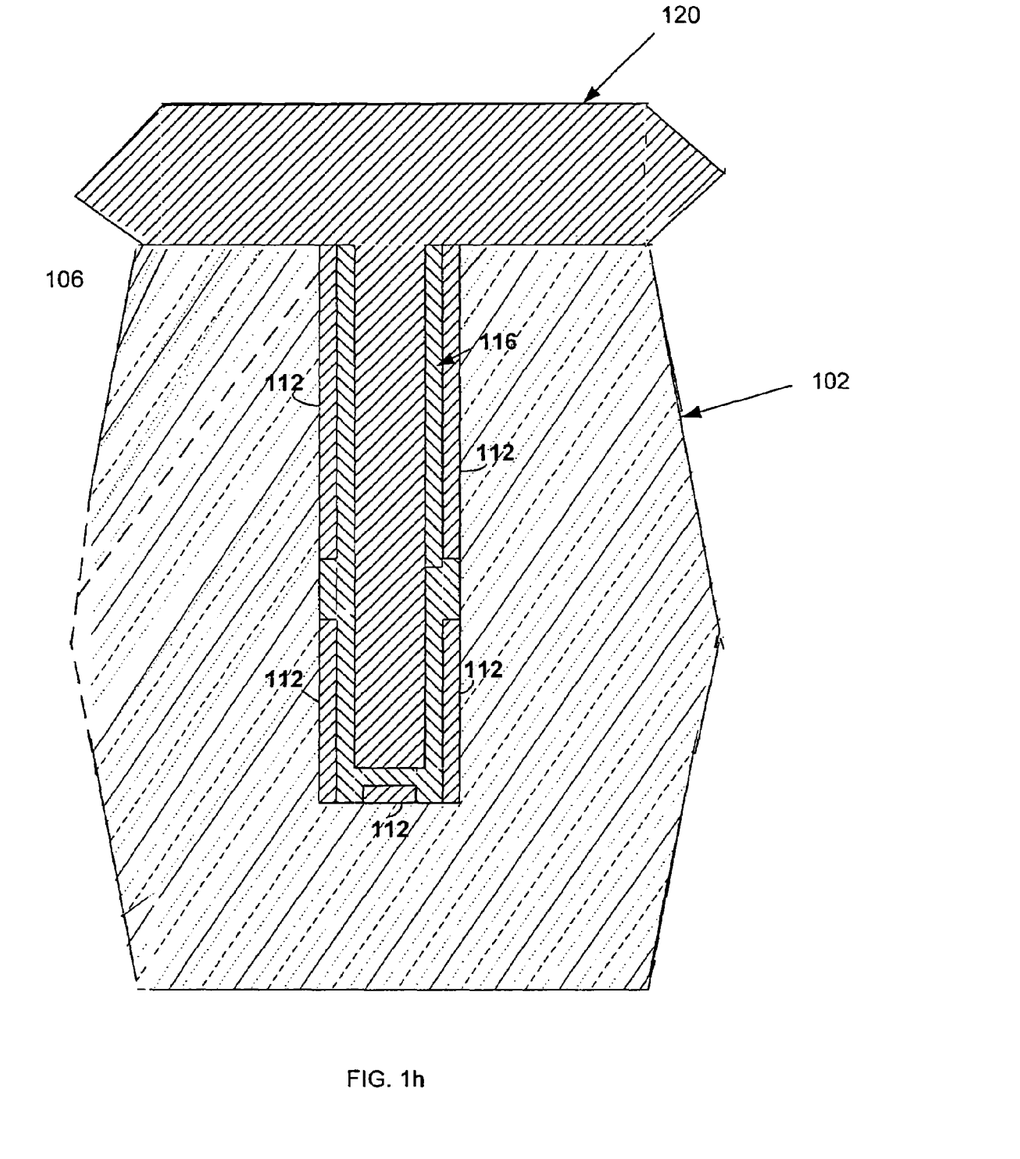

As shown in FIG. 1h, a metal fill layer 120 may be formed on the seed layer 116. The metal fill layer 120 may comprise metallic materials including but not limited to copper. The metal fill layer 120 may be formed on the seed layer 116 by utilizing an electroplating process, as is well known in the art. The metal fill layer 120 forms on the seed layer 116 within the recess 104 such that the recess is substantially filled with the metal fill layer 120, with the absence of voids (such as are present in prior art recesses without an electroless seed layer 116 deposited over the non-continuous metal layer 112).

Figure 1I:
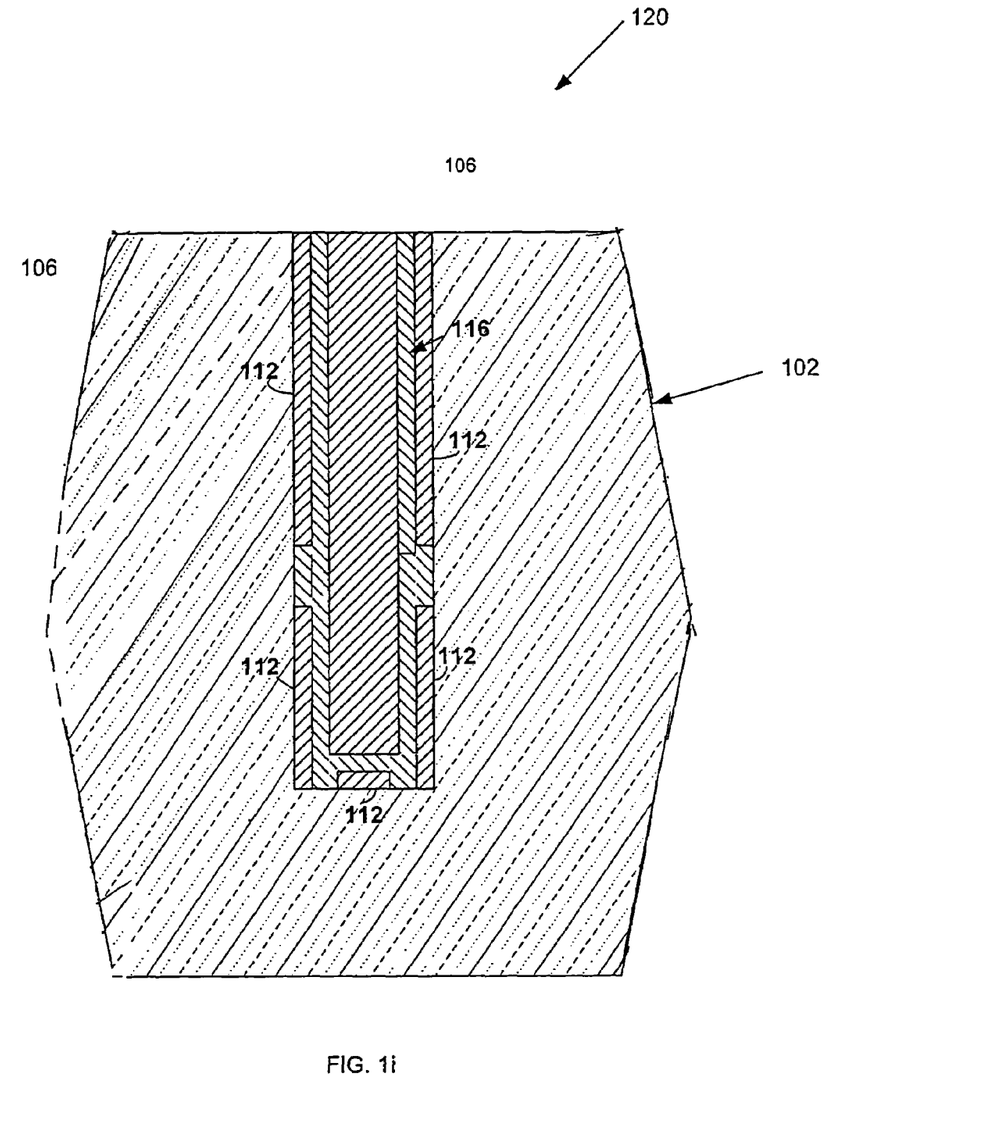

The electrolessly deposited seed layer 116 prevents the formation of voids in the metal fill layer 120, since the metal fill layer 120 can plate or form over a continuous electroplated seed layer film, such as the seed layer 116. Such a continuous seed layer would not be possible with the use of a sputtered seed layer deposited directly on the non-continuous metal layer 112 (such as is used in the prior art), since using a sputtered seed layer would not result in a continuous film within the recess due to the shadowing effects previously described herein. The metal fill layer 120 may be subsequently polished using a chemical mechanical polishing technique, for example, as is well known in the art (see FIG. 1i).

As described above, the present invention provides methods and associated structures of forming a continuous seed layer in a high aspect recess that enables a substantially void free metal fill layer, thus greatly enhancing the reliability and performance of a microelectronic device fabricated according to the various embodiments of the present invention.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that the fabrication of a multiple metal layer structure atop a substrate, such as a silicon substrate, to manufacture a microelectronic device is well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A microelectronic structure, comprising:
   a recess in a substrate;
   a non-continuous metal layer disposed within the recess;
   an activation layer disposed on the non-continuous metal layer and disposed on at least one non-deposited inner wall region of the recess, wherein the activation layer comprises a thickness of less than about 300 angstroms;
   a seed layer disposed on the activation layer; and
   a metal fill layer disposed on the seed layer.

2. The structure of claim 1 wherein the seed layer comprises a grain size of about 1 micron in diameter or greater.

3. The structure of claim 1 wherein the non-continuous metal layer comprises at least one of titanium, tantalum, tantalum nitride, tantalum silicon nitride, tungsten, titanium tungsten, titanium nitride, titanium silicon nitride or a combination thereof.

4. The structure of claim 1 wherein the seed layer comprises copper.

5. The structure of claim 1 wherein the recess comprises a high aspect ratio recess, wherein the high aspect ratio comprises an aspect ratio greater than about 3.

6. The structure of claim 1 wherein the metal fill layer comprises a substantially void free metal fill layer.

7. The structure of claim 1 wherein the activation layer comprises at least one of a palladium or platinum.

* * * * *